July 10, 1973 SHIGERU MITSUI 3,745,071

SELECTIVE LIQUID GROWTH PROCESS

Filed Dec. 6, 1971

SHIGERU MITSUI,
INVENTOR

BY Wenderoth, Lind & Ponack

ATTORNEYS

United States Patent Office 3,745,071

Patented July 10, 1973

3,745,071

SELECTIVE LIQUID GROWTH PROCESS

Shigeru Mitsui, Itami, Japan, assignor to Mitsubishi Denki Kabushiki Kaisha, Tokyo, Japan Filed Dec. 6, 1971, Ser. No. 205,050
Claims priority, application Japan, Dec. 15, 1970, 45/112,019
Int. Cl. H01l 7/38
U.S. Cl. 148—171 4 Claims

ABSTRACT OF THE DISCLOSURE

A coating of a metal oxide reducible to the corresponding metal in a reducing atmosphere is first disposed in a predetermined pattern on a surface of a semiconductor substrate. The oxide may be $SnO_2$, $In_2O_3$ or $Ga_2O_3$. Then the substrate is subjected to the conventional liquid growth process in an atmosphere of reducing gas such as hydrogen to selectively grow a semiconductor layer in those portions occupied by the oxide of its surface. Also there is disclosed the formation of a Gunn diode on a GaAs substrate.

BACKGROUND OF THE INVENTION

This invention relates to a process of growing a semiconductor layer in a predetermined pattern on the surface of a semiconductor substrate from the liquid phase and more particularly to a selective liquid growth process suitable for producing semiconductor elements such as Gunn diodes.

Upon producing Gunn diodes on the substrate of gallium arsenide (GaAs), it is often practiced to selectively grow the N type layer of gallium arsenide on the substrate from the liquid phase by the epitaxial growth technique. Conventional selective liquid growth processes generally employed have comprised the steps of disposing a coating of silicon dioxide ($SiO_2$), for example, on one surface of the substrate of a suitable semiconductive material, selectively removing the coating from the surface of the substrate to expose the surface in a predetermined pattern, covering the surface of the substrate with the remaining portion of the coating with a certain amount of a molten metal including the semiconductive material to be grown, and thereafter slowly cooling the molten metal to grow the semiconductive material into a layer on the exposed surface portion of the substrate. With the substrate formed from a III–V Group compound such as gallium arsenide, those processes have not been satisfactory, in many cases, because in the step of forming the silicon dioxide coating on the surface of the substrate, gallium and arsenic oxides are formed on the same surface, which prevents the molten metal from well wetting the latter. Therefore, the use of the conventional selective liquid growth processes for producing Gunn diodes and like devices of gallium arsenide have given rise to trouble in that, in addition to a higher proportion of rejects, it is difficult to produce products having consistently good characteristics.

SUMMARY OF THE INVENTION

Accordingly, it is an object of the invention to provide an improved selective liquid growth process suitable for producing semiconductor elements such as Gunn diodes.

It is another object of the invention to provide an improved process of easily growing a layer of semiconductive material in a predetermined pattern on the surface of a semiconductor substrate with high accuracy.

It is a further object of the invention to produce Gunn diodes in accordance with the process as described in the preceding paragraph.

The invention accomplishes these objects by the provision of a selective liquid growth process of growing a layer of semiconductive material in a predetermined pattern on the surface of the substrate of semiconductive material in accordance with the well known liquid growth technique per se, characterized in that a metal oxide reducible to the corresponding metal in a reducing atmosphere is first disposed in the predetermined pattern on the surface of the substrate and then the selective liquid growth is effected in a reducing atmosphere to grow layers of semiconductive material only on those portions occupied by the metal oxide of the surface of the substrate.

The metal oxide may be preferably one selected from the group consisting of stannic oxide ($SnO_2$), indium trioxide ($In_2O_3$) and gallium trioxide ($Ga_2O_3$).

BRIEF DESCRIPTION OF THE DRAWING

The invention will become more readily apparent from the following detailed description taken in conjunction with the accompanying drawing in which.

DESCRIPTION OF THE PREFERRED EMBODIMENTS

Figure 1A:
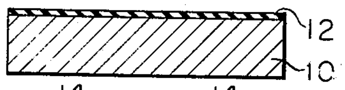
FIGS. 1*a* through *c* are sectional views illustrating a substrate of semiconductive material processed in different manufacturing stages of a selective liquid growth process in accordance with the principles of the prior art.
Figure 1B:
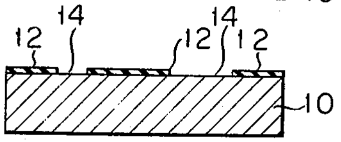

Referring now to the drawings and FIG. 1 in particular, a substrate 10 of any suitable semiconductive material is shown as having an oxide coating 12 disposed on one surface thereof. The coating may be, for example, of silicon dioxide. Then the coating 12 is selectively removed from the substrate 10, e.g., by a well known chemically etching technique so that those portions 14 of the surface of the substrate 10 on which semiconductive layers are to be subsequently grown from the liquid phase are exposed. FIG. 1*b* shows the structure after the coating has been selectively removed from the substrate 10.

Figure 1C:
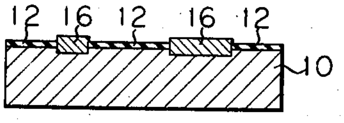

The subsequent stage is to cover the coating 12 including the exposed surface portions of the substrate 10 with an amount of suitable molten metal (which is called hereinafter a "melt") at an elevated temperature, for example, at 800° C. including a semiconductive material to be grown on the surface portion 14. Then the melt is slowly cooled at a predetermined cooling rate to permit the latter semiconductive material to be grown on the surface portions 14 of the substrate from the melt or liquid phase. The resulting structure is shown in FIG. 1*c* wherein the reference numeral 16 designates the semiconductor layer thus grown.

Heretofore, the process as above described has been generally employed to selectively grow semiconductor layers on the substrate from the liquid phase, but it has not, in many cases, given satisfactory results, particularly for III–V Group compounds such as gallium arsenide forming the substrate. This is because, in the stage of forming the silicon dioxide coating on the surface of the substrate, gallium and arsenic oxides are simultaneously formed on the same surface of the substrate, which prevents the melt from completely wetting the surface.

Therefore, upon producing, for example, Gunn diodes or similar devices on the substrate of gallium arsenide, conventional processes, such as above described have given rise to trouble in that, in addition to a high proportion of rejects, it is difficult to obtain products having consistenly good characteristics.

The present invention contemplates the elimination of the abovementioned troubles encountered in the prior art practice. It comprises the steps of forming a coating of a metal oxide in a predetermined pattern on a surface of a substrate of semiconductive material, the metal oxide being reducible to the corresponding metal in a reducing atmosphere, covering the surface of the substrate including the coating with an amount of a melt in a reducing atmosphere, the melt including a semiconductive material to be grown, and slowly cooling the melt at a predetermined cooling rate to grow the last mentioned semiconductive material into layers from the melt only on those portions occupied by the metal oxide of the surface of the substrate.

In practicing the invention, the substrate may be of any semiconductive material and suitable examples thereof involve germanium, silicon, III–V Group compounds such as gallium arsenide (GaAs), gallium phosphide (GaP), gallium antimonide (GaSb), indium phosphide (InP), indium arsenide (InAs), indium antimonide (InSb), etc.

As above described, the coating disposed on the surface of the substrate should be formed of such a metal oxide that it can be reduced to the corresponding metal upon selectively growing the semiconductive material on the surface of the substrate, that is to say, in the reducing atmosphere and at the growing temperature involved. The metal oxide is preferably one selected from the group consisting of stannic oxide ($SnO_2$), antimony trioxide ($In_2O_3$) and gallium trioxide ($Ga_2O_3$).

Also the melt can include the carrier formed of any suitable metallic material employed in a conventional liquid growth process. For example, the melt may include one of tin (Sn), indium (In), gallium (Ga), etc. Also, the semiconductive material included in the melt may be any one of those above described in conjunction with the substrate.

FIG. 2 illustrates various manufacturing steps in accordance with the principles of the invention in terms of the selective growth of the gallium arsenide layer on a substrate formed of gallium arsenide. In FIG. 2*a*, a substrate 20 of gallium arsenide has disposed on one surface thereof a coating 22 formed of stannic oxide ($SnO_2$) usually known as "NESA" glass. The coating may be formed on the substrate by heating the substrate in the air to from 400° to 600° C. and spraying a solution of stannous chloride ($SnCl_2$) dissolved into alcohol or water upon the surface of the substrate. This measure permits the coating of stannic oxide ($SnO_2$) to be easily deposited to a thickness of from 100 to 1000 A. on the surface of the substrate 20.

Figure 2A:
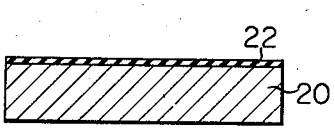
FIGS. 2*a* through *e* are sectional views illustrating a substrate of semiconductive material processed in different manufacturing stages of a selective liquid growth process in accordance with the principles of the invention.
Figure 2B:
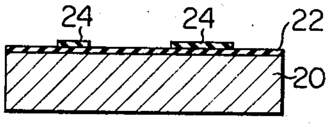

Then as shown in FIG. 2*b*, a mask 24 made of any suitable photoresist is put on the coating 22 to cover those portions of the coating located upon the surface portions of the substrate where the selective growth is to be subsequently effected from the liquid phase. Thereafter the exposed portion of the coating 22 is chemically removed from the substrate, such as by putting a zinc powder on the coating and then spraying with dilute hydrochloric acid.

Figure 2C:
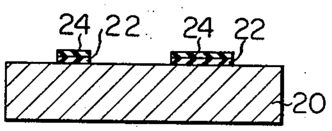
Figure 2D:
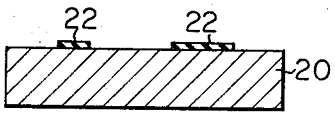

The resulting structure has the coating 22 disposed in a predetermined pattern on the surface of the substrate and is shown in FIG. 2*c*. The removal of the mask 24 leads to the structure as shown in FIG. 2*d*.

Figure 2E:
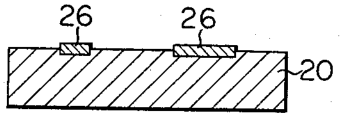

The succeeding step is a selective growth from the liquid phase well known in the art. To this end, the upper surface of the substrate 20 with the coating 22 disposed thereon is covered with an amount of a melt including gallium arsenide dissolved into tin, as a carrier, in an atmosphere of hot hydrogen. Then the melt is slowly cooled at a predetermined cooling rate for selective growth from the liquid phase. In this stage, gallium arsenide layers are grown on those portions occupied by the stannic oxide of the surface of the substrate while no layer is formed on those portions not occupied by such an oxide on the surface. The resulting structure is shown in FIG. 2*e* wherein the reference numeral 26 designates the layer grown on the substrate 20 from the melt or liquid phase.

The fact that the gallium arsenide layers 26 are selectively grown in place on the surface of the substrate 20 is believed to result from the reduction of stannic oxide of the coating to tin in the atmosphere of hot hydrogen which serves, in turn, to cause the melt to wet well those portions initially occupied by the stannic oxide of the surface of the substrate.

While the invention has been illustrated and described so that the surface of the substrate is entirely covered with the coating followed by the selective removal of the coating it is to be understood that the coating may be directly disposed in a predetermined pattern on the surface of the substrate within the scope of the invention. For example, one may prepare a mask of any suitable metallic material having windows in a predetermined pattern in which the semiconductor layers are to be grown on one surface of the substrate although the mask is not illustrated. Then the mask thus prepared is placed on the surface of the substrate and then a solution of stannous chloride dissolved into water or alcohol may be sprayed on the surface of the substrate with the mask to form a coating of stannic oxide in a predetermined pattern on the surface of the substrate as above described in conjunction with FIG. 2*c*.

Figure 3A:
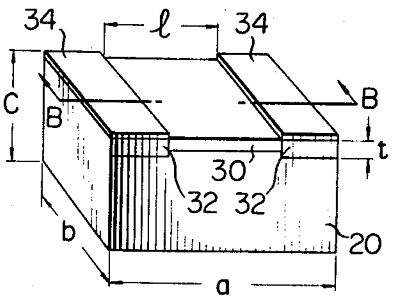
FIG. 3*a* is a perspective view of a Gunn diode produced in accordance with the principles of the invention.

FIG. 3 shows typically a planar Gunn diode constructed in accordance with the process of the invention as above described. First, on one surface of a substrate 20 of intrinsic gallium arsenide doped with chromium (Cr) and having a length *a* of 200 microns, a width *b* of 50 microns and a thickness *c* of 100 microns was epitaxially grown an N type layer 30 of gallium arsenide to a thickness $t_1$ of about 5 microns (see FIG. 3*a*). The figure just specified are, by way of example, mentioned and the invention is not restricted to those figures. The epitaxially grown layer 30 had a carrier concentration of $5\times10^{14}$ atoms per cubic centimter and a carrier mobility of about 7000 $cm.^2/v.$ sec.

Figure 4:
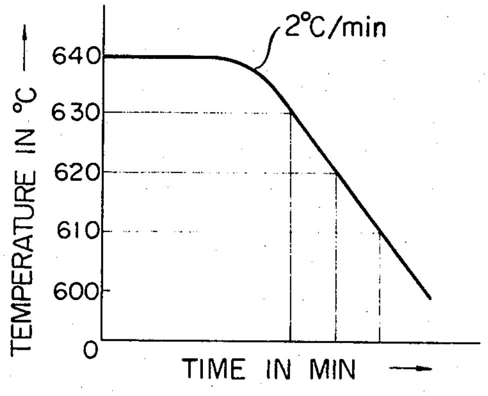
FIG. 4 is a graph illustrating typically a cooling curve that may be utilized to produce Gunn diodes in accordance with the process of the present invention.

Then as above described in conjunction with FIG. 2, a coating of any suitable metal oxide such as stanic oxide was disposed on each of the opposite end portions of the N type layer 30 with a distance *l* between the opposite edges of both coating being of 100 microns. The coatings, however, are not illustrated. Thereafter, melt including tin, saturated with N type gallium arsenide, at a predetermined temperature (from which the selective liquid growth operation is to be initiated) was placed on the surface of the N type layer 30 thus processed in a hydrogen atmosphere and slowly cooled at a cooling rate of 2° C./min. from 630° C. to 620° C. following the cooling curve shown in FIG. 4 wherein the temperature of the melt in the ordinate is plotted against time in the abscissa. This resulted in the conversion of that portion of the N type grown layer 30 disposed under the coating to an $N^+$ type region 32 having a thickness of about 5 microns and a carrier concentration of about $10^{19}$ atoms per cubic centimeter.

A gold-germanium alloy was alloyed on the surface of each converted layer 32 to form an ohmic contact 34 thereon resulting in the completion of a planar Gunn diode.

When pulses having a duration of 1 microsecond and a pulse repetition frequency of 1 kilohertz were applied to the Gunn diode thus produced, the latter was oscillated at a fundamental oscillation frequency of 1 gigahertz. Also the same Gunn diode attached to a copper sink effected successfully a continuous wave oscillation at a frequency of about 1 gigahertz.

It has been found that the thickness of the converted layer 32 depends upon the temperature conditions during the growth from the liquid phase. For example, when the melt, as above described, was cooled from 630° C. to 610° C. along the curve shown in FIG. 4, the resulting layer 32 exhibited a higher surface level than that of the layer 30. However the distance *l* between both layers 32 remained unchanged from that obtained with a decrease in temperature of the melt from 630° C. to 620° C.

Further, if the growth process is initiated above 630° C., the conversion layer is greater than that formed through the cooling from 630° C. to 620° C. in a thickness measured from the surface of the substrate under the same growth conditions; that is, the thickness exceeds 5 microns. On the other hand, if the growth process is initiated below 630° C., the resulting thickness is less than 5 microns.

In either case, the distance *l* between the conversion regions is maintained substantially constant within an error of ±2 microns. That figure of error is sufficiently small as compared with that inherent in the masking and etching techniques involved. This means that the present invention makes it possible to increase the accuracy with which the semiconductive layer is grown from the liquid phase.

While the invention has been illustrated and described in conjunction with a few preferred embodiments thereof and also with a Gunn diode, it is to be understood that numerous changes and modifications may be resorted to without departing from the spirit and scope of the invention. For example, the invention is equally applicable to the formation of the emitted region for NPN type transistors composed of gallium arsenide or other semiconductive materials. In the latter case, a P type gallium arsenide may be epitaxially grown on one surface of a substrate of $N^+$ type gallium arsenide acting as a collector to form a P type base region. Then an $N^+$ type emitter region of gallium arsenide is formed on the surface of the base region in a similar manner as above described, in conjunction with the formation of the converted region 32 shown in FIG. 3. Since there are presently scarcely found diffusion techniques for diffusing the N type conductivity imparting impurity into substrates of semiconductive compounds such as gallium arsenide, the present invention plays an important role in producing a variety of semiconductor devices.

What is claimed is:

1. A process of selectively growing a layer of semiconductive material on the surface of a semiconductive substrate from the liquid phase, comprising the steps of selectively forming a coating of metal oxide in a predetermined pattern on the surface of the substrate of a semiconductive material selected from the group consisting of gallium arsenide, germanium and silicon, said metal oxide being reducible to the corresponding metal in a hydrogen reducing atmosphere by heating, said metal oxide being selected from the group consisting of stannic oxide, indium trioxide and gallium oxide, applying a melt onto the surface of the substrate in a hydrogen reducing atmosphere, said melt containing the semiconductive material to be grown and a metal selected from the group consisting of tin, indium and gallium, and slowly cooling said melt to grow from said melt a layer of the last mentioned semiconductive material only on those portions occupied by said metal oxide on the surface of the substrate.

2. A process as claimed in claim 1 wherein the substrate is formed of gallium arsenide, the metal oxide is stannic oxide, and the melt contains tin and semiconductive gallium arsenide.

3. A process of producing a Gunn diode, comprising the steps of epitaxially growing a layer of N type gallium arsenide on the surface of a substrate of gallium arsenide, forming a coating of metal oxide on either of both end portions of said epitaxially grown layer, said metal oxide being reducible to the corresponding metal in an atmosphere of hot hydrogen and selected from the group consisting of stannic oxide, indium trioxide and gallium oxide, applying a melt onto the surface of said N type gallium arsenide layer in an atmosphere of hot hydrogen, said melt containing semiconductive gallium arsenide and also a metal selected from the group consisting of tin, indium and gallium, and slowly cooling said melt at a predetermined temperature to form a highly doped N type gallium arsenide layer only on those portions occupied by said metal oxide on the surface of the substrate.

4. A process as claimed in claim 3 wherein said metal includes tin saturated with semiconductive gallium arsenide at a predetermined temperature from which the melt is cooled.

References Cited

UNITED STATES PATENTS

| | | | |
|---|---|---|---|
| 3,158,512 | 11/1964 | Nelson et al. | 148—1.5 |
| 3,160,534 | 12/1964 | Oroshnik | 148—177 |
| 3,344,071 | 9/1967 | Cronin | 252—62.3 G A |
| 3,435,306 | 3/1969 | Martin | 317—234 V X |
| 3,532,562 | 10/1970 | Clawson et al. | 148—179 |
| 3,535,772 | 10/1070 | Knight et al. | 148—171 X |
| 3,537,919 | 11/1970 | Bittmann | 148—175 |
| 3,607,463 | 9/1971 | Kinoshita | 148—171 |

GEORGE T. OZAKI, Primary Examiner

U.S. Cl. X.R.

148—172, 175; 252—62.3 G A, 62.3 E; 317—234 V, 235 C; 117—201

UNITED STATES PATENT OFFICE

CERTIFICATE OF CORRECTION

Patent No. 3,745,071 Dated July 10, 1973

Inventor(s) Shigeru Mitsui

Figure 3B:
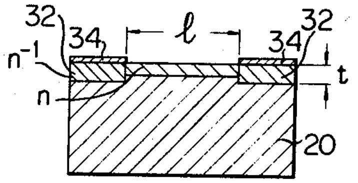
FIG. 3*b* is a sectional view taken along the line B—B of FIG. 3*a*.

It is certified that error appears in the above-identified patent and that said Letters Patent are hereby corrected as shown below:

In the drawings, Fig. 3b, change "$n^{-1}$" to -- $n^+$ --.

Signed and sealed this 6th day of August 1974.

(SEAL)
Attest:

McCOY M. GIBSON, JR.
Attesting Officer

C. MARSHALL DANN
Commissioner of Patents